(12) United States Patent
Noujeim

(10) Patent No.: US 7,402,757 B1
(45) Date of Patent: Jul. 22, 2008

(54) METHOD, SYSTEM, AND APPARATUS FOR REDUCING TRANSITION CAPACITANCE

(75) Inventor: Leesa M. Noujeim, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 292 days.

(21) Appl. No.: 11/133,499

(22) Filed: May 19, 2005

(51) Int. Cl.
*H01R 12/04* (2006.01)

(52) U.S. Cl. .......... 174/261; 174/255; 361/780

(58) Field of Classification Search .......... 174/520, 174/250, 255, 258, 261, 262; 361/763, 767, 361/780, 808
See application file for complete search history.

(56) References Cited

U.S. PATENT DOCUMENTS

| | | | |
|---|---|---|---|
| 6,384,476 B2 | 5/2002 | Takeuchi | |
| 6,448,639 B1 | 9/2002 | Ma | |
| 6,650,014 B2 | 11/2003 | Kariyazaki | |
| 6,680,530 B1 * | 1/2004 | Pillai et al. | 257/700 |
| 6,734,545 B1 | 5/2004 | Yamamura | |
| 6,734,555 B2 | 5/2004 | Boireau | |
| 6,747,362 B2 | 6/2004 | Barrow | |
| 6,812,803 B2 * | 11/2004 | Goergen | 333/1 |
| 7,061,096 B2 * | 6/2006 | Fjelstad et al. | 257/698 |
| 2002/0008314 A1 | 1/2002 | Takeuchi | |
| 2002/0180004 A1 * | 12/2002 | Oggioni et al. | 257/621 |
| 2003/0047349 A1 | 3/2003 | Boireau | |
| 2004/0113257 A1 | 6/2004 | Boireau | |
| 2006/0137902 A1 * | 6/2006 | Kubota et al. | 174/250 |

* cited by examiner

*Primary Examiner*—Jeremy C. Norris
*Assistant Examiner*—Yuriy Semenenko
(74) *Attorney, Agent, or Firm*—Martine Penilla & Gencarella, LLP

(57) ABSTRACT

A printed circuit board (PCB) is provided. The PCB includes a signal layer, a first reference plane defined adjacent to a first side of the signal layer, and a via passing through the signal layer and the first reference plane. The first side of the signal layer is either above the signal layer or below the signal layer. The via is configured to accept an electrical signal to be routed on the signal layer. The inner area of the first reference plane up to the via is capable of being eliminated.

16 Claims, 6 Drawing Sheets

METHOD, SYSTEM, AND APPARATUS FOR REDUCING TRANSITION CAPACITANCE

BACKGROUND

Typically, signals are transmitted from a source to the destination through signal traces and interconnections such as through-hole vias. Such interconnections, however, can introduce discontinuities in the transmission path, thus detrimentally affecting signal fidelity. For instance, in certain scenarios, high frequency components of the signals may be reflected multiple times, thus preventing the signals to get through to the receiver. Furthermore, it is well established that through-hole signal vias have capacitance to the reference planes that the through-hole signal vias traverse. In particular, it has been recognized that the greater the number of reference planes a through-hole signal via passes through, the higher the capacitance between the through-hole signal via and the ground layers will be. Yet further, the greater the surface area of the ground layer defined in immediate proximity to the through-hole signal via, the higher the capacitance can be. Generally, several shortcomings are associated with discontinuity capacitance (e.g., limiting signal trace speed, increasing bit error rate, etc.).

Currently, reducing capacitance between the through-hole signal via and the ground layers is achieved by forming blind/buried vias or back drilling. In the first alternative, typically, blind vias are formed by drilling holes through only the necessary reference planes. However, implementing blind/buried vias has certain limitations. For instance, forming blind vias is a very costly process.

Alternatively, back drilling can be used to lower through-hole via capacitance. Once the vias have been formed through all the layers of the PCB, portions of the vias not being used in the transmission paths are physically removed. Similar to blind vias, however, several limitations can be associated with back drilling vias. Yield loss and increase in cost are two of such limitations.

SUMMARY

It should be appreciated that the present invention can be implemented in numerous ways, such as a process, an apparatus, a system, a device, or a method on a computer readable medium. Several inventive embodiments of the present invention are described below.

In one embodiment, a printed circuit board (PCB) is provided. The PCB includes a signal layer, a first reference plane defined adjacent to a first side of the signal layer, and a via passing through the signal layer and the first reference plane. The first side of the signal layer is either above the signal layer or below the signal layer. The via is configured to accept an electrical signal to be routed on the signal layer. The inner area of the first reference plane up to the via is capable of being eliminated.

In another embodiment, a method for reducing transition capacitance in a PCB assembly is provided. The method provides a PCB that has a signal layer and a reference plane. The reference plane is defined on a first side of the signal layer. A via is defined through the reference plane and the signal layer. An electrical signal is routed on the signal layer using the via. An inner area of the reference plane up to the via is eliminated.

In yet another embodiment, another PCB is provided. The PCB includes an upper signal layer, a lower signal layer, an upper reference plane that separates the upper signal layer and the lower signal layer, a lower reference plane, an innermost via, and an outermost via. The lower reference plane is disposed under the lower signal layer. The innermost via is configured to accept an electrical signal from an innermost contact terminal to be routed on the upper signal layer. The outermost via is configured to accept an electrical signal from an outermost contact terminal to be routed on the lower signal layer. At least an inner area of the upper reference plane up to the innermost via or an inner area of the lower reference plane up to the outermost via is capable of being eliminated.

In still another embodiment, another method for reducing transition capacitance in a PCB assembly is provided. The method includes providing a PCB having signal layers and reference planes. Each pair of adjacent signal layers is separated by a reference plane. An innermost contact terminal of an integrated circuit component is routed on an uppermost signal layer defined in the PCB using an innermost via. The innermost contact terminal is the closest contact terminal to the innermost area of the integrated circuit component. An outermost contact terminal of the integrated circuit component is routed on a lowermost signal layer defined in the PCB using an outermost via. The outermost contact terminal is the farthest away contact terminal from the innermost area of the integrated circuit component. A plurality of successive contact terminals of the integrated circuit component that extend from the innermost contact terminal to the outermost contact terminal is routed on a corresponding signal layer of a plurality of successive signal layers that extend from the uppermost signal layer to the lowermost signal layer using a respective via of a plurality of vias extending from the innermost via to the outermost via. Each successive contact terminal is configured to be connected to a successively lower signal layer using a successive via when proceeding from the innermost via to the outermost via. At least one inner area of a plurality of inner areas is eliminated. The plurality of inner areas includes the inner area of an upper reference plane up to the innermost via and inner areas of successively lower reference planes up to a corresponding successive via when proceeding from the innermost via to the outermost via.

According to yet another embodiment of the present invention, an electronic system is provided. The system includes a PCB and a chip component. The PCB includes an upper signal layer, a lower signal layer, an upper reference plane separating the upper signal layer and the lower signal layer, a lower reference plane disposed under the lower signal layer, an innermost via, and an outermost via. The chip component is mounted on the PCB and includes a plurality of successive contact terminals. The innermost via is configured to accept an electrical signal from an innermost contact terminal of the plurality of successive contact terminals to be routed on the upper signal layer. The outermost via is configured to accept an electrical signal from an outermost contact terminal of the plurality of successive contact terminals to be routed on the lower signal layer. At least an inner area of the upper reference plane up to the innermost via or an inner area of the lower reference plane up to the outermost via is eliminated.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

One of ordinary skill in the art must recognize and appreciate that although specific reference may have been made to terminology defined by Sun Microsystems, Inc., it should be understood that any name could be used for such terms, so long as the desired functionality is achieved.

The present invention reduces capacitance associated with transitions in signal transmission paths. In one embodiment, one or more inner areas of the reference planes not acting as return current paths for the respective immediately adjacent signal traces can be eliminated. In one aspect, by reducing the surface areas of the reference planes defined close to the signal vias, a clean transmission environment can be maintained.

According to one implementation of the present invention, an innermost contact terminal defined closest to an innermost area (herein interchangeably also referred to as the center of the integrated circuit component) is routed on the uppermost signal layer in a printed circuit board (PCB) using an innermost via. In one example, while moving away from the innermost area of the integrated circuit component toward an edge of the integrated circuit component, each contact terminal defined farther away from the innermost area of the integrated circuit component is routed on a successively lower signal layer of the PCB using a successive via. Furthermore, an outermost contact terminal defined the farthest from the innermost area of the integrated circuit component (i.e., close to the edge of the integrated circuit component) is routed on the lowermost signal layer of the PCB using the outermost via. Thereafter, the inner area of at least one reference plane up to the respective via is eliminated, thus reducing transition capacitance. In one embodiment, the inner areas of the reference planes up to the respective vias can be eliminated.

Figure 1:
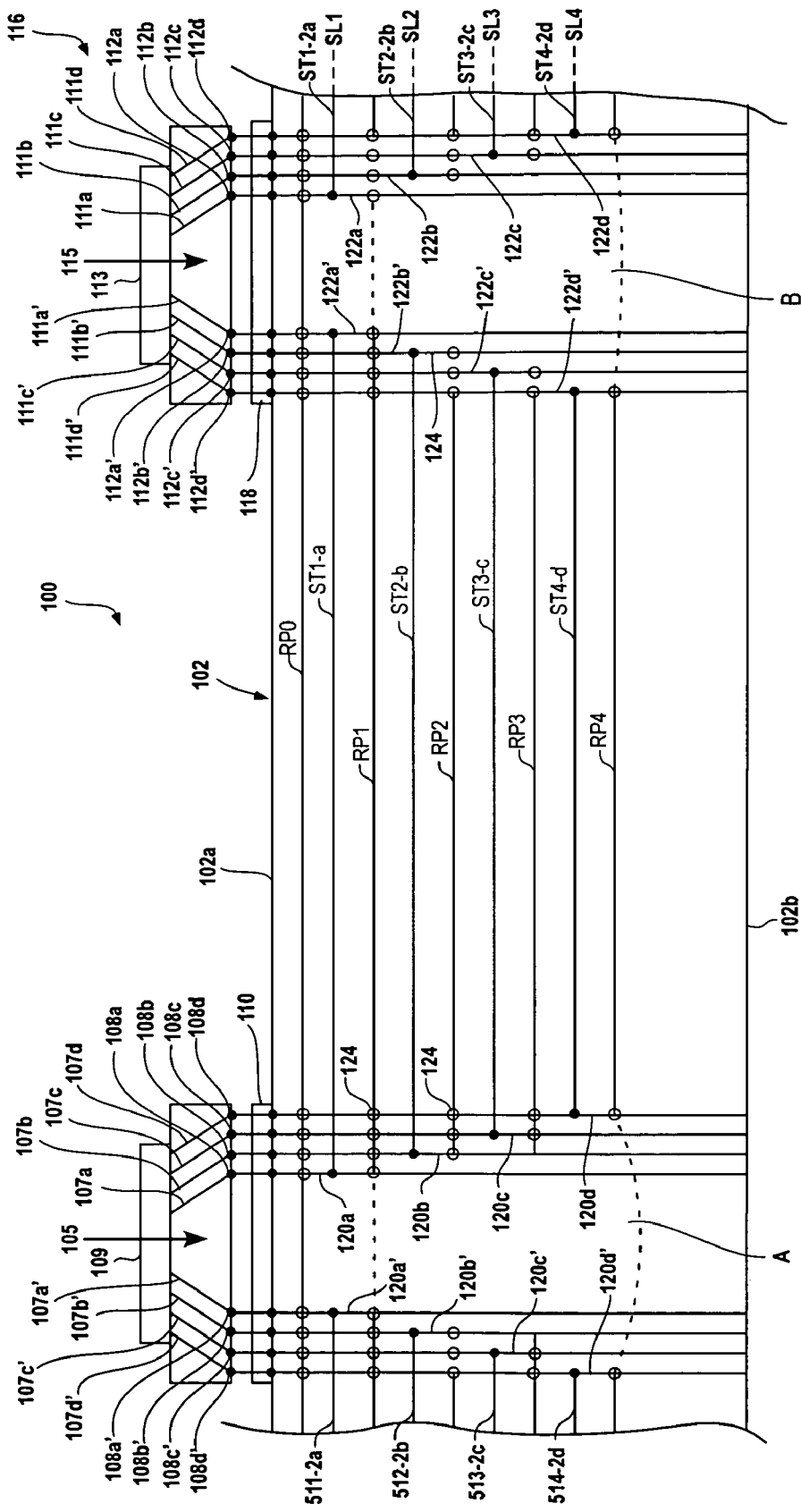
FIG. 1 is a simplified partial cross-sectional view of an exemplary printed circuit board (PCB) assembly, in accordance with one embodiment of the present invention.

FIG. 1 is a simplified cross-sectional view illustrating an exemplary PCB assembly 100, in accordance with one embodiment of the present invention. Data is being transmitted from a transmitting package 106 to a receiving package 116 through an exemplary PCB 102 using the signal path routing technique of the present invention, in accordance with one embodiment of the present invention. Dies 109 and 113 have been mounted on the respective transmitting and receiving packages 106 and 116. The transmitting and receiving packages 106 and 116 are configured to protect the dies 109 and 113, respectively, and provide external electrical connections to the PCB 102. In the illustrated embodiment, the transmitting and receiving packages 106 and 116 are pin grid array (PGA)-type packages and include signal pins 108a to 108d and 108a' to 108d', and 112a to 112d and 112a' to 112d', respectively. In one implementation, the transmitting and receiving packages 106 and 116 are identified as four-signal-row deep packages, which in one example, each includes four concentric rows of signal pins surrounding a respective package center 105 and 115. For ease of reference, signal pins 108a, 108a', 112a, and 112a' are herein referred to as innermost signal pins (i.e., signal pins defining the rows closest to the package centers 105 and 115 (also referred to as the innermost area of the package)), signal pins 108b, 108b', 112b, and 112b' are herein referred to as second row signal pins, signal pins 108c, 108c', 112c, and 112c' are herein referred to as third row signal pins, and signal pins 108d, 108d', 112d, and 112d' are herein defined as outermost signal pins (i.e., signal pins defining the row farthest from the respective package center 105 and 115).

A metallization pattern on the transmitting package 106 connects die 109 to signal pins 108a-108d and 108a'-108d' of the transmitting package 106. In the same manner, a metallization pattern on the receiving package 116 connects the die 113 to the signal pins 112a-112d and 112a'-112d' of the receiving package 116. In the illustrated embodiment, the signal pins 108a to 108d and 108a' to 108d', and 112a to 112d and 112a' to 112d' are placed on the bottom surfaces of the transmitting and receiving packages 106 and 116, respectively. Of course, one of ordinary skill in the art must appreciate that in one aspect, the signal pins can be defined on the package in any suitable mechanics so long as the functionality of the signal pins can be achieved. In one embodiment, each of the transmitting and receiving packages 106 and 116 is mounted on the PCB 102 using PGA-type sockets 110 and 118, respectively. Of course, the footprint on sockets 110 and 118 are defined so as to match the footprint of signal pins 108a to 108d and 108a' to 108d', and 112a to 112d and 112a' to 112d' defined in the corresponding transmitting and receiving packages 106 and 116. In one example, PGA-type sockets 110 and 118 are mounted on the PCB 102 using solder balls. Of course, one must note that in a different embodiment, any appropriate mechanism can be implemented to secure the transmitting and receiving packages 106 and 116 on the PCB 102.

As illustrated, the PCB 102 interconnects the electronic components such as the transmitting and receiving packages 106 and 116. The PCB 102 illustrated in FIG. 1 is shown to have nine (9) layers, with four (4) signal layers designated as SL1 through SL4, and five (5) reference planes designated as RP0 to RP4. Of course, one must appreciate and acknowledge that the PCB 102 can include any appropriate number of layers so long as the functionality of the PCB 102 can be achieved.

A plurality of through-hole vias 120a to 120-d, 120a' to 120d', and 122a to 122d, and 122a' to 122d' has been formed through the nine layers of the PCB 102, extending from a top surface 102a of the PCB 102 down to a bottom surface 102b of the PCB 102. To prevent shorting, antipads 124 have been defined in RP0-RP4 around each of the vias 120a to 120-d, 120a' to 120d', 122a to 122d, and 122a' to 122d'. One of ordinary skill in the art can appreciate that the routing technique of the present invention can be applied to any vertical region of the PCB 102. For instance, in one example, the routing technique of the present invention can be applied to the vertical region defined between RP1 and RP4.

The RP0 to RP4 and the SL1 to SL4 are shown to be interlaced, respectively. Specifically, RP0 is defined above and close to the SL1, RP1 is defined below and close to the SL1, the RP2 is defined below and close to the SL2, the RP3 is defined below and close to the SL3, and the RP4 is defined below and close to SL4. Of course, one of ordinary skill in the art must appreciate that a respective insulating layer (not shown in the Figure) is defined between consecutive layers (e.g., between RP0 and SL1, SL1 and RP1, RP1 and SL2, SL2 and RP2, etc.). Aside from the antipads 124, the RP0 to RP4 are sheets of conductor material, and as such, occupy planer regions of respective layers of the PCB 102. In one implementation, the planer region can be referred to the surface area of a reference plane defined below or above a signal trace. One of ordinary skill in the art can appreciate that the planes can be used for other purposes than signal return paths. In one example, the RP0 to RP4 are configured to carry the return current, or to provide the return path for the signal traces. Of course, in one example, if desired, the RP0 to RP4 can occupy the entire respective layers of the PCB 102.

Each of the signal traces (ST) ST1-a to ST4-d defined at the SL1 to SL4, correspondingly, is a part of the respective signal path defined between the transmitting package 106 and the receiving package 116. According to one example, each of the ST1-a to ST4-d, in conjunction with the respective RP0 to RP4 forms the transmission line for each signal. Of course, one of ordinary skill in the art must appreciate that in one example, the ST1-a (i.e., a top signal trace) can form a transmission line in conjunction with RP0 and RP1. In another aspect, the ST1-a can form a transmission line in conjunction with either RP0 or RP1. In yet another example, the ST4-d can form a transmission line in conjunction with RP3 and RP4. In still another embodiment, the ST4-d can form a transmission line with either the RP3 or the RP4. In sum, each upper signal trace can form a transmission line with the corresponding reference planes defined immediately above and below the upper signal trace. In the alternative, the upper signal trace can form a transmission line with either a corresponding reference plane defined immediately below the signal trace or the corresponding reference plane defined immediately above the signal trace. Similarly, in one aspect, each lower signal trace can form a transmission line with respective reference planes defined immediately above and immediately below the lower signal trace. In another embodiment, each lower signal trace can form a transmission line with a corresponding reference plane defined immediately above the lower signal trace or the corresponding reference plane defined immediately below the lower signal trace.

In accordance with one implementation of the present invention, the innermost signal pins 108a, 108a', 112a', and 112a are routed on the uppermost SL1 using vias 120a, 120a', 122a', and 122a, respectively. In the same manner, the outermost signal pins 108d, 108d', 112d', and 112d are routed on the lowermost SL4 using corresponding vias 120d, 120d', 122d', and 122d. In one exemplary embodiment, the first signal transmission path between the transmitting package 106 and receiving package 116 can be described as follows: a signal trace 107a defined within the transmitting package 106 connects the die 109 to the transmitting package innermost signal pin 108a. The first signal transmission path is thereafter extended from the innermost signal pin 108a to the socket 110, which is then continued to the via 120a and thereafter to the signal trace ST1-a defined at SL1 of the PCB 102. The first signal transmission path then continues to the via 122a', the socket 118, and the innermost signal pin 112a' of the receiving package 116. Lastly, the first signal transmission path continues from the innermost signal pin 112a' to the die 113 through a signal trace 111a' defined within the receiving package 116.

In the illustrated embodiment, a second signal transmission path encompasses the following components: from the die 109 to the trace 107b, the second row signal pin 108b, the socket 110, the via 120b, the ST2-b, the via 122b', the socket 118, the second row signal pin 112b' of the receiving package 116, the trace 111b', and ultimately the die 113 of the receiving package 116. In the same manner, third and fourth signal paths respectively start with the die 109 and continue to traces 107c and 107d, respectively. The third signal transmission path includes: the trace 107c, the third row signal pin 108c, the socket 110, the via 120c, the ST3-c, the via 122c', the socket 118, the third row signal pin 112c', a trace 111c', and finally the die 113 of the receiving package 116. Lastly, the fourth signal transmission path involves: the trace 107d, the outermost signal pin 108d, the socket 110, the via 120d, the ST4-d, the via 122d', the socket 118, the outermost signal pin 112d', a trace 111d', and ultimately the die 113 of the receiving package 116. In one example, the length of the signal traces 107a to 107d, 107a' to 107d', 111a to 111d, and 111a' to 111d' can be approximately one and half inch long.

Following the same signal transmission routing technique, signal transmission paths are formed between the transmitting package 106 and another receiving package (not shown) starting from the die 109 to traces 107a' to 107d', corresponding signal pins 108a' to 108d', the vias 120a' to 120d', and ST1-xa to ST4-xd. Similarly, signal transmission paths are formed between the receiving package 116 and another transmitting package (not shown). ST1-za to ST4-zd to corresponding vias 122a to 122d, signal pins 112a to 112d, corresponding traces 111a and finally to 111d, and thereafter to the die 113.

As illustrated in the embodiment depicted in FIG. 1, the inner area of the RP0 is remained in tact. However, elimination of the inner areas of RP1 to RP4 can form a region A within the PCB 102 below the interface of the transmitting package 106 and the PCB 102. Accordingly, in one example, the inner area of at least one RP up to the respective via can be eliminated so as to reduce transition capacitance by using the routing technique of the present invention. Of course, in one aspect, the inner areas of all the reference planes defined in the PCB 102 can be eliminated. One of ordinary skill in the art must recognize and appreciate that in another aspect, the inner area of the RP0 may also be removed. For instance, the elimination pattern for the inner area of the RP0 can be similar to the elimination pattern of the RP1.

The region A has the largest surface area at the lowermost reference plane of the PCB 102 (i.e., the lowermost reference plane of the vertical region of interest, specifically, the RP4. Furthermore, the region A has the smallest surface area at the RP1 (the uppermost reference plane of the vertical region of interest). In fact, in one embodiment, the surface area of the inner area of the RP4 can be as large as the surface area of the transmitting package 106. In the same manner, elimination of the inner areas of the RP1 to RP4 can create a region B within the PCB 102 below the interface of the receiving package 116 and the PCB 102. As such, the region B illustrates absence of the inner areas of the RP1 to RP4. The region B is illustrated to have the largest surface area at the RP4 of the PCB 102 (i.e., the lowermost reference plane of the vertical region of interest). Furthermore, the surface area of the region B at the RP1 (i.e., the uppermost reference plane of the vertical region of interest) is shown to be the smallest. Similar to the region A, in one aspect, the surface area of the inner area at the RP4 can be as large as the surface area of the receiving package 116.

Of course, one of ordinary skill in the art must acknowledge and appreciate that according to one embodiment, signal pins from any given row of the package can be routed on any particular signal layer (e.g., the upper most signal layer of the vertical region of interest, etc.), so long as the next row signal pins defined farther away from the center of the packages 105 and 115 are routed on the same signal layer or the next signal layer defined farther down within the PCB 102. Furthermore, one of ordinary skill in the art must appreciate that signals from the signal pins in multiple rows maybe routed on a single signal layer so long as the routing is performed in accordance with the routing scheme of the present invention. Additional information regarding the routing scheme of the present invention is provided below with respect to FIGS. 2A-4.

Additionally, one of ordinary skill in the art must appreciate that the PCB 102 can be constructed from any suitable material so long as the functionality of the PCB 102 can be achieved (e.g., flame retardant-4 (FR-4), Duroid, Alumina, etc.). Furthermore, although in one embodiment of the present invention PCBs are used, in a different embodiment, any structure capable of providing the functionalities of the PCB can be implemented (e.g., flex circuit, multichip module, etc.). Still further, one of ordinary skill in the art must appreciate that although in the embodiment depicted in FIG. 1 the PCB 102 has nine layers, in a different embodiment, the PCB 102 can have any suitable number of layers so long as the functions of the PCB can be achieved. By way of example, the PCB 102 maybe constructed without the RP0 and/or RP4.

Yet further, while in the illustrated embodiment the partial cross-section of the PCB includes 16 through-hole vias, one must note that the PCB can include any suitable number of through-hole vias. Still further, although in one example of the present invention vias are through-hole vias, in a different embodiment, the vias can be any type of non-through hole vias (e.g., blind vias, etc.). Additionally, although in the illustrated embodiment only the routing technique of the present invention has been implemented to reduce transition capacitance, in a different embodiment, one or more techniques implemented to reduce transition capacitance can be used in conjunction with the routing technique of the present invention so as to improve the reduction of the transition capacitance resulting by each of the one or more techniques.

Moreover, one of ordinary skill in the art must recognize that the vertical region of interest in the PCB can include only selected layers of the PCB. As such, according to one aspect, the top layer of the PCB can extend above the upper layer of the vertical region and the bottom surface of the PCB can extend below the lower layer of the vertical region (e.g., in a PCB having 20 layers, the routing technique of the present invention can be applied only to layers four (4) to 18 of the PCB defined in the vertical region of interest). In another embodiment, the vertical region of the PCB maybe defined so as to include all the layers of the PCB.

Still further, although in one example, the routing technique of the present invention has been applied such that the inner areas of all the reference planes have been eliminated, in a different embodiment, the routing technique of the present invention can be applied to eliminate an inner area of at least one reference plane. Additionally, even though in one implementation the routing technique of the present invention has been applied to planer regions of the PCB 102 defined below both, transmitting package 106 and receiving package 116, in a different implementation, the routing technique of the present invention can be applied to the planer region of at least one integrated circuit component.

Moreover, one of ordinary skill in the art must appreciate that although in one embodiment of the present invention transmitting and receiving packages are used as external structures, in a different embodiment, any suitable component capable of acting as a container, die protector, or external electrical connector can be implemented (e.g., mezzanine connector, card edge connector, socket, chip scale package, etc.). Furthermore, one of ordinary skill in the art must appreciate that the transmitting package 106 and receiving package 116 can act as any suitable component. For example, in one embodiment, the transmitting package 106 can function as a central processing unit (CPU) while the receiving package 116 acts as a memory controller, the receiving package can act as the CPU while the receiving package acts as the peripheral component interconnect (PCI) Bridge, the transmitting package 106 can be a multicore CPU transmitting signals to yet another multicore CPU acting as the receiving package, application specific independent circuits as transmitting and/or receiving packages, etc.

Still further, one of ordinary skill in the art must recognize and appreciate that although in the exemplary embodiment the transmitting and receiving packages 106 and 116 have been secured to the PCB 102 using sockets 110 and 118, respectively, in a different embodiment, the packages 106 and 116 can be secured to the PCB 102 using any appropriate component so long as the function of securing the packages to the PCB can be achieved (e.g., a soldered interconnect, signal pins, etc.). Yet further, the sockets can be mounted on the PCB using any suitable mounting mechanism (e.g., solder balls, pressure contacts, etc.). Still further, although in the exemplary embodiment of the present invention the transmitting and receiving packages 106 and 116 are PGA packages, in a different embodiment, the packages can be any type of package suitable for mounting on the top surface of the PCB or the bottom surface of the PCB (e.g., ball grid arrays (BGA) (e.g., tape and/or tab BGA, ceramic column grid array (CCGA), etc.), chip scaled packages (CSP), land grid array (LGA), signal pin grid array (PGA), etc.).

It must be noted that FIG. 1 depicts the cross section of the PCB assembly corresponding to the fifth row signal pins of the transmittal and receiving packages and the respective fifth row signal traces for SL1 to SL4, as well as the corresponding fifth row signal vias for SL1 to SL4. However, for ease of reference and understanding, the embodiment in FIG. 1 has been described without any reference to the specific location of the cross section with respect to the transmitting and receiving packages as well as the PCB. Nonetheless, additional details and specifics regarding the routing technique of the present invention with reference to the locations of the signal pins, signal traces, signal vias, etc. are provided in FIGS. 2A-4.

Figure 2A:
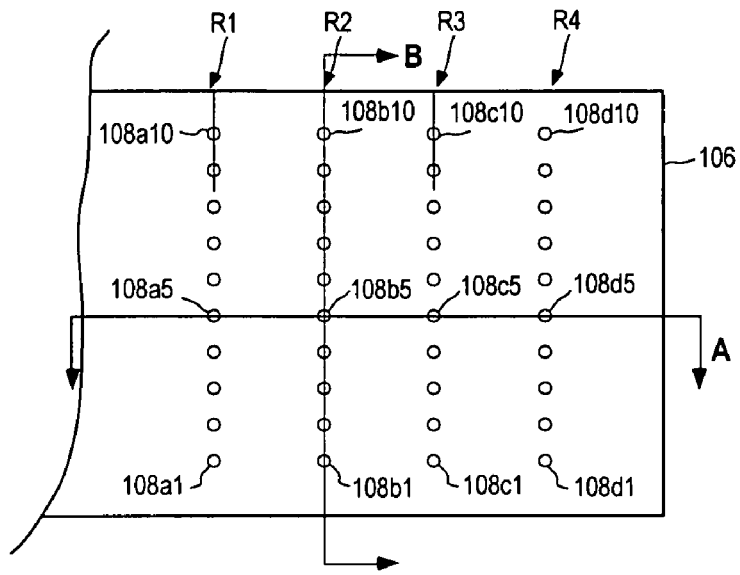
FIG. 2A is a partial bottom view of the transmitting package depicted in FIG. 1, in accordance with another embodiment of the present invention.
Figure 2B:
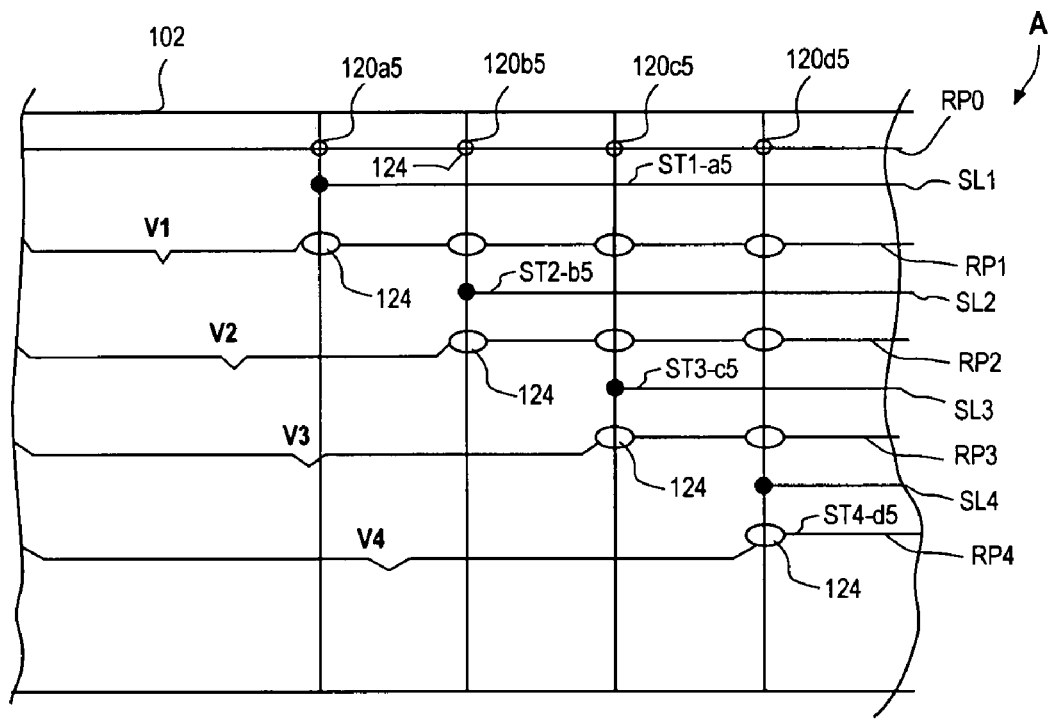
FIG. 2B is a cross-sectional view of the PCB depicted in FIG. 1 corresponding to the cross-section A of the transmitting package shown in FIG. 2A, in accordance with still another embodiment of the present invention.

Proceeding to FIG. 2A, a partial bottom view of the transmitting package 106 is depicted, in accordance with one embodiment of the present invention. The transmitting package 106 is shown to have four signal rows R1 to R4, each including ten (10) signal pins 108$a$1-108$a$10, 108$b$1-108$b$10, 108$c$1-108$c$10, and 108$d$1-108$d$10, correspondingly. FIG. 2B is a cross-sectional view of the PCB 102 corresponding to the cross-section "A" of the transmitting package 106 shown in FIG. 2A, according to one implementation of the present invention. As can be seen, the signal from the innermost signal pin 108a5 is routed on the ST1-a5 using the corresponding via 120a5. An inner area v1 of the RP1 defined before the via 120a5 has been eliminated as the inner area v1 does not act as a current return path for the ST1-a5. In the same manner, the signal from the second row signal pin 108b5 is routed on the signal trace ST2-b5 using the corresponding via 120b5. An inner area v2 of the RP2 defined before the via 120b5 has been eliminated as the inner area v2 does not act as a current return path for the ST2-b5. In the same manner, the signal from the signal pin 108c5 is routed on the ST3-c5 using the corresponding via 120c5. An inner area v3 of the RP3 defined before the via 120c5 has been eliminated as the inner area v3 does not act as a current return path for the ST3-c5. Lastly, the signal from the signal pin 108d5 is routed on the ST4-d5 using the corresponding via 120d5. An inner area v4 of the RP4 defined before the via 120d5 has been eliminated as the inner area v4 does not act as a current return path for the ST4-d5. Comparatively, in the illustrated embodiment, the inner area of the RP0 has been left intact, even though the inner area of the RP0 does not act as the current return path for the ST1-a5. As can be seen, the surface area of the inner area v4 of the RP4 defined immediately adjacent to the SL4 is greater than the surface areas of the inner areas v1, v2, and v3. Furthermore, the surface area of the inner area v1 of the RP1 defined immediately adjacent to the SL1 is smaller than the surface areas of the inner areas v2, v3, and v4.

One of ordinary skill in the art must appreciate that in one embodiment, the present invention can lower capacitance without substantially adding any extra processing stages and/or manufacturing parts. For instance, in accordance with one embodiment of the present invention, the mask is fabricated for each layer of the PCB without the inner areas of the reference planes.

Figure 2C:
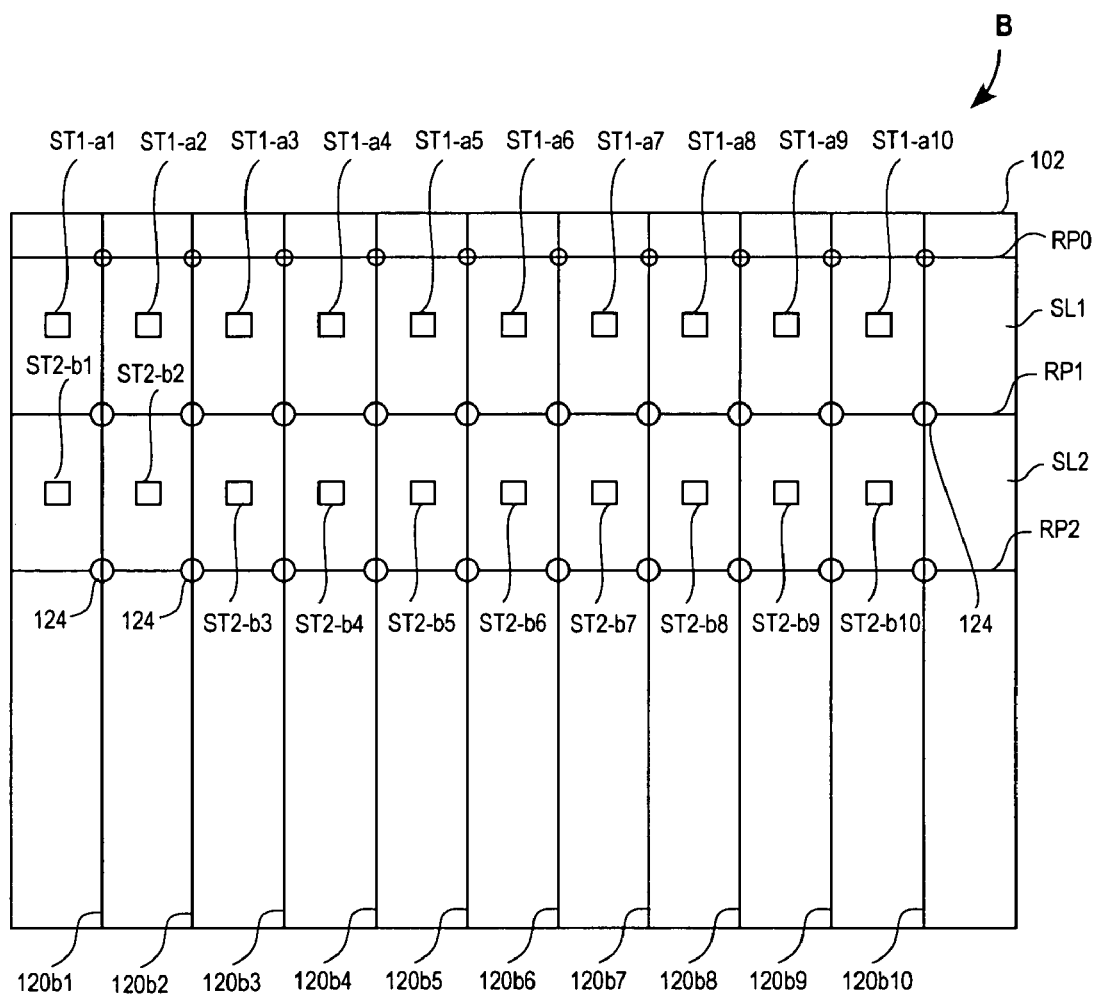
FIG. 2C is a cross-sectional view of the PCB depicted in FIG. 1 corresponding to the cross-section B of the transmitting package shown in FIG. 2A, in accordance with yet another embodiment of the present invention.

Reference is made to FIG. 2C depicting a simplified cross-sectional view of the PCB 102 corresponding to the cross-section "B" of the transmitting package 106 shown in FIG. 2A, according to one embodiment of the present invention. Signal traces defined at the SL1 and SL2 can be seen due to the cross-section B being defined on the second row signal pins 108b1 to 108b10. That is, in accordance with one embodiment of the present invention, signals from the innermost signal pins 108a1 to 108a-10 are routed on the SL1 through signal traces ST1-a1 to ST1-a10. Furthermore, the signals from the second row signal pins 108b1 to 108b10 have been routed on the second row SL2 through signal traces ST2-b1 to ST2-b10. Antipads 124 defined in RP0 to RP2 around the vias 120b1 to 120b10 can be seen. However, in accordance with one embodiment of the present invention, the signal traces routed on the SL3 from the third row signal pins and the signal traces routed on the SL4 from the outermost signal pins 108d1 to 108d10 cannot be seen at the cross-section B.

Figure 3:
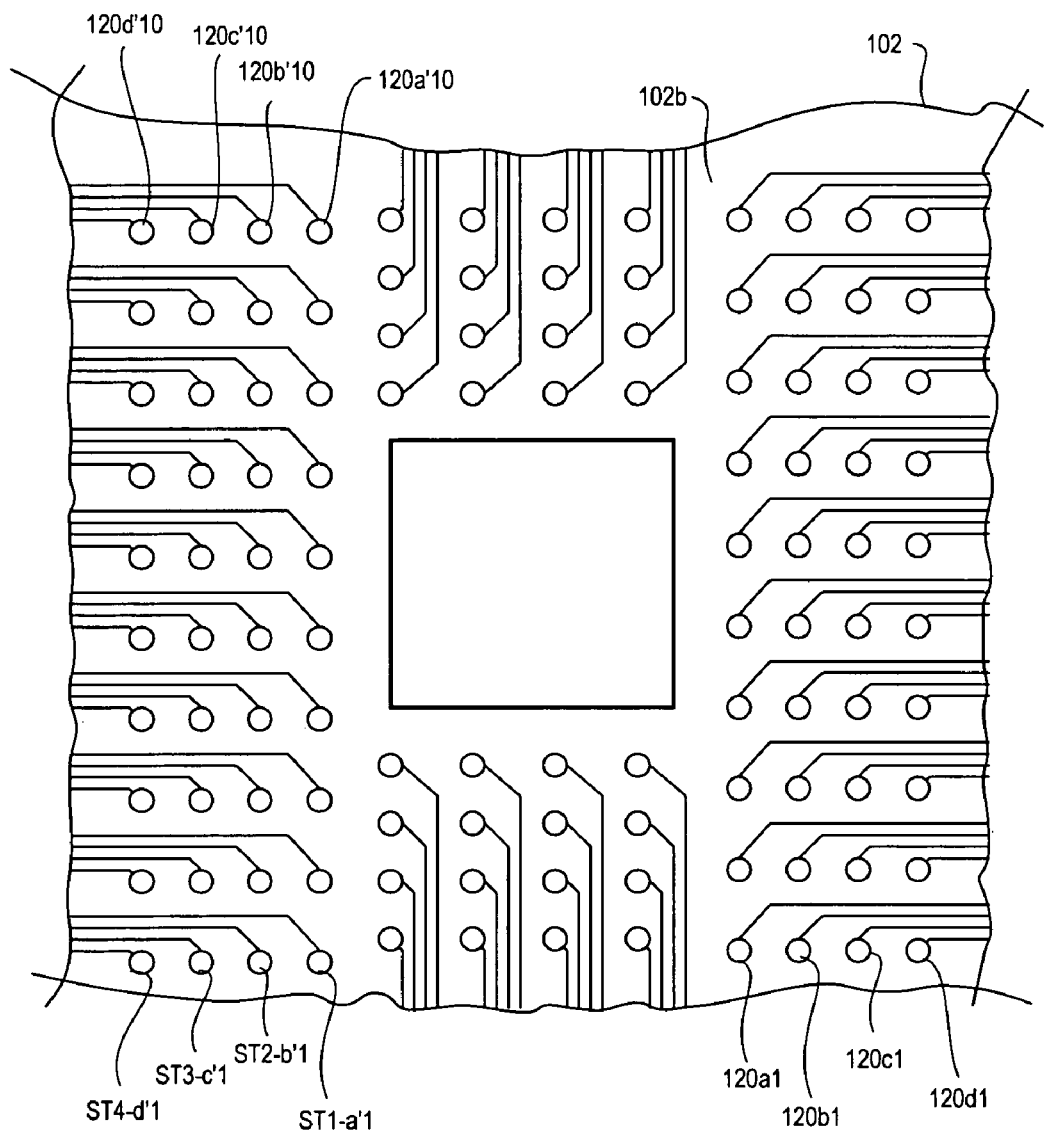
FIG. 3 depicts a bottom view of the PCB depicted in FIG. 1, in accordance with yet another embodiment of the present invention.

Continuing to FIG. 3, a partial bottom view of the PCB 102 shown in FIG. 1 is depicted, in accordance with one embodiment of the present invention. Four rows of signal vias each including 10 signal vias, are illustrated. Particularly, signal vias 120a1 to 120a10, 120a'1 to 120a'10, 120b1 to 120b10, 120b'1 to 120b'10, 120c1 to 120c10, 120c'1 to 120c'10, 120d1 to 120d10, 120d'1 to 120d'10 have been depicted. All signal traces routed on the innermost signal vias are shown to be longer than the signal traces routed to the second row vias. In turn, the signals routed to the second row vias are longer than the signal traces routed to the third row vias, which in turn are longer than the signal traces routed to the outermost signal vias. As can be seen, ST1-a' is longer than ST2-b'1, ST3-c'1, and ST4-d'1.

Figure 4:
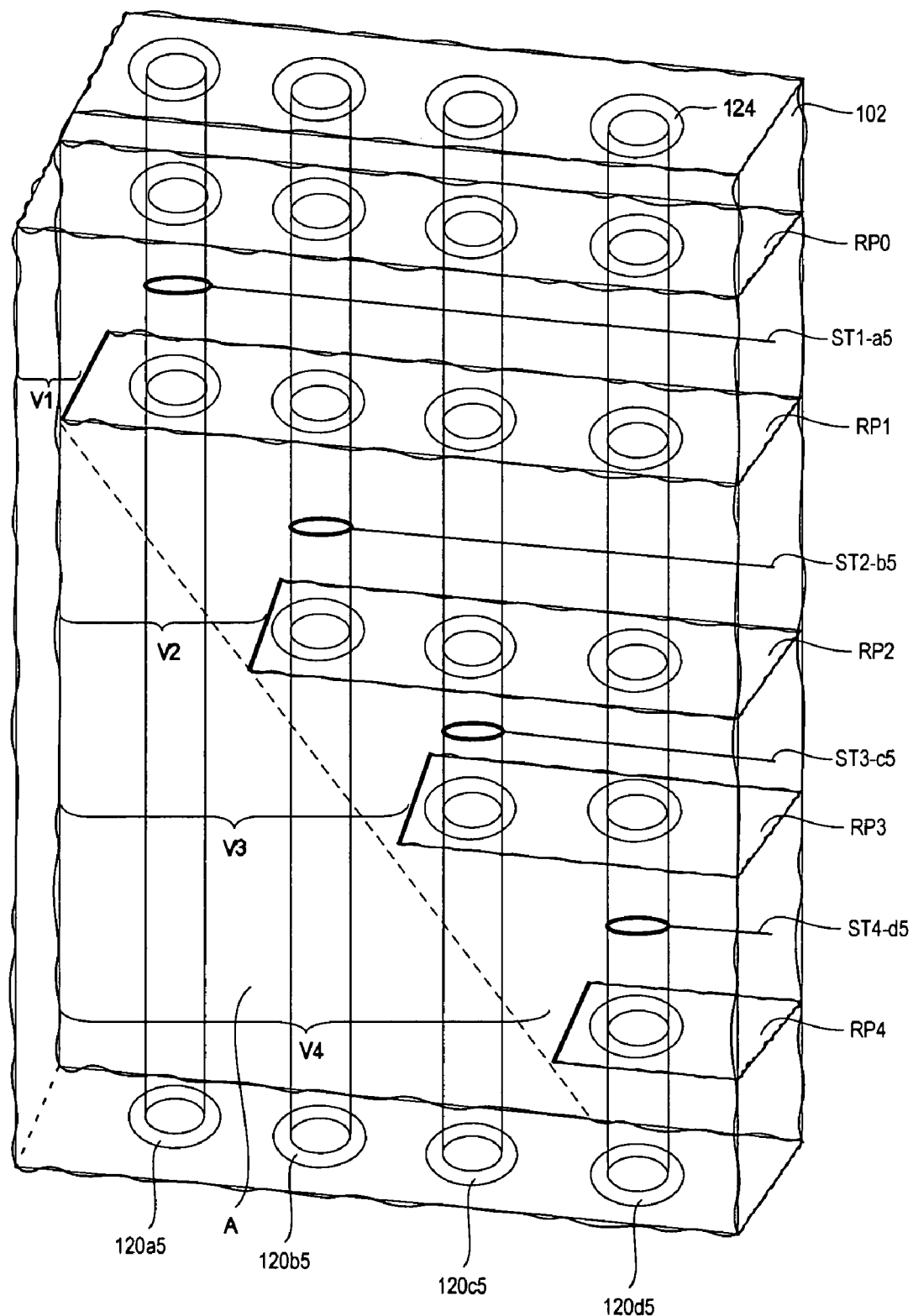
FIG. 4 depicts a partial isometric view of the PCB depicted in FIG. 1, in accordance with yet another embodiment of the present invention.

Reference is made to FIG. 4 illustrating a partial isometric view of the PCB 102 depicted in FIG. 1, in accordance with one embodiment of the present invention. As depicted, the signal trace ST1-a5 defined at the SL1 has a length that is greater than the length of the signal traces ST2-b5, ST3-c5, and ST4-d5. As shown, the signal trace ST4-d5 defined at the SL4 has the shortest length. As a result, the surface area of the inner area v1 of the RP1 (the part of the RP1 not acting as a return current path for the ST1-a5) is less than the surface area of the inner area v2 of the RP2 (the part of the RP2 not acting as a return current path for the ST1-b5), surface area of the inner area v3 of RP3 (the part of the RP3 not acting as a return current path for the ST3-c5), and the surface area of the inner area v4 of the RP4 (the part of the RP4 not acting as a return current path for the ST4-d5). As illustrated, the region A is shown to have a greater surface area at the lowermost reference plane RP4 and the smallest surface area at the uppermost reference plane RP1. Of course, one of ordinary skill in the art must appreciate that in one example, the insulating material separating the layers as well as the vias 120a to 120d have remained substantially intact.

Figure 5:
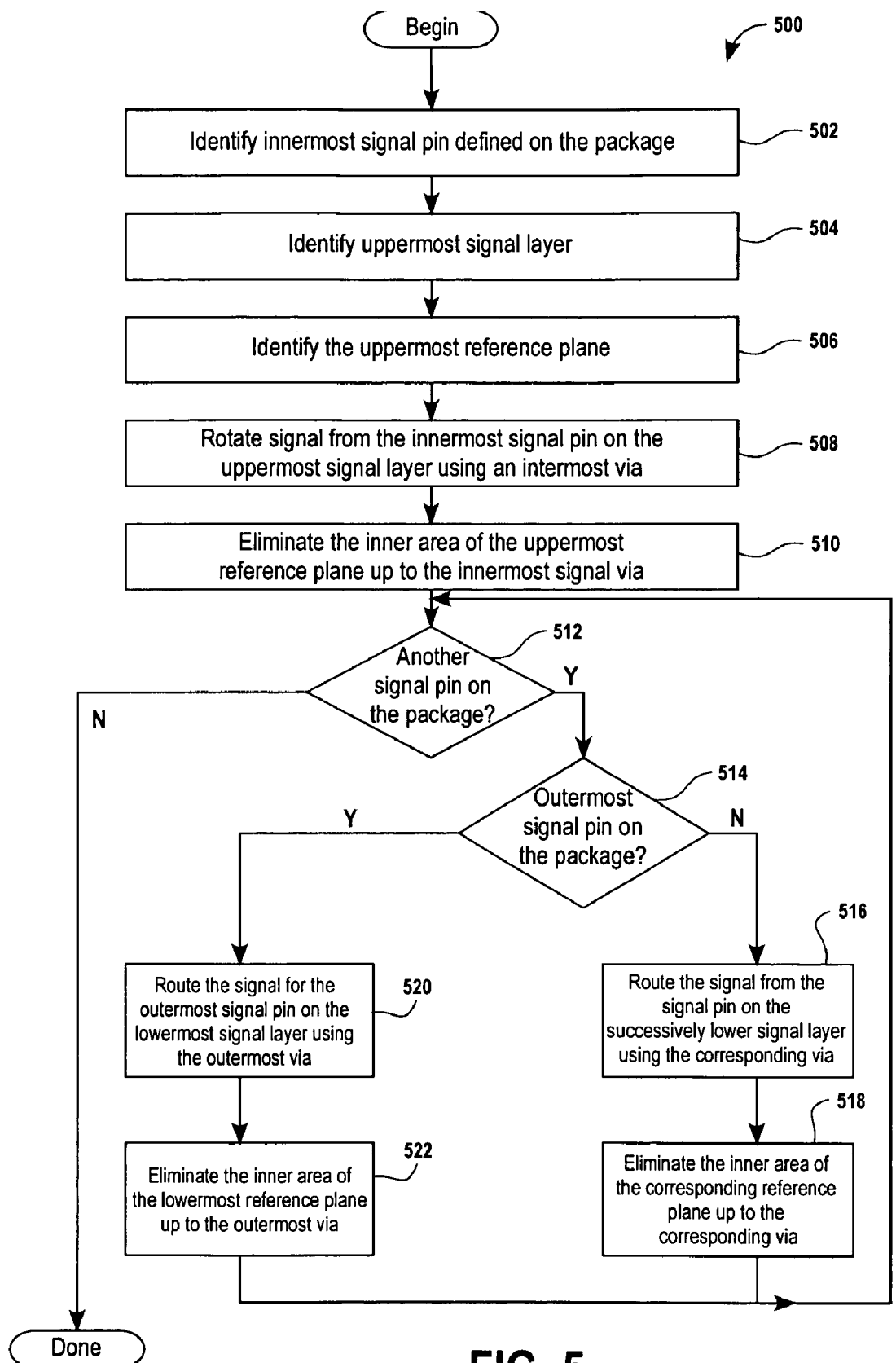
FIG. 5 depicts a flowchart diagram showing method operations performed to reduce transition discontinuity in an exemplary PCB assembly, in accordance with yet another embodiment of the present invention.

Reference is made to a flowchart diagram 500 illustrated in FIG. 5 depicting method operations performed to reduce transition capacitance (e.g., via discontinuity), in accordance with one embodiment of the present invention. The method begins in operation 502 in which the innermost signal pin on a package is identified followed by operation 504 wherein the uppermost signal layers of a PCB is identified. The uppermost reference plane is identified in operation 506. The innermost signal pin is routed on the uppermost signal layer using an innermost via in operation 508 and the inner area of the uppermost reference plane up to the innermost via is eliminated in operation 510. Additional information with respect to routing signals from the packages mounted on the PCB to the signal layer is provided with respect to FIGS. 1-4.

In operation 512, a decision is made as to whether another signal pin is defined on the package. If another signal pin is defined on the package, the method continues to operation 514 wherein a determination is made as to whether the identified signal pin is the outermost signal pin on the package. If the signal pin is not the outermost signal pin, the method continues to operation 516 in which the signal for the signal pin is routed on the successively lower signal layer using the corresponding via (i.e., the successive via extending from the innermost via to the outermost via). The inner area of the successively lower reference plane corresponding to the successively lower signal layer is eliminated up to the corresponding via in operation 518. Thereafter, the method continues to operation 512.

If in operation 514 a determination is made that the signal pin is the outermost signal pin on the package, the signal for the outermost signal pin is routed on the lowermost signal layer in the PCB using the outermost via in operation 520. The inner area of the lowermost reference plane up to the outermost via is eliminated in operation 522 and the method return to operation 512. Of course, one must note that the uppermost signal layer and the lowermost signal layer can refer to the uppermost signal layer and the lowermost signal layer of the vertical region of interest.

Embodiments of the present invention may be implemented in various computer system configurations including hand-held devices, microprocessor systems, microprocessor-based or programmable consumer electronics, minicomputers, mainframe computers and the like. The invention can also be used in distributed computing environments where tasks are performed by remote processing devices that are linked through a wire-based or wireless network.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A printed circuit board (PCB) onto which an integrated circuit package containing an integrated circuit is mounted, comprising:
    a signal layer;
    a first reference plane defined adjacent to a first side of the signal layer, the first side of the signal layer being one of above the signal layer and below the signal layer; and
    a via passing through the signal layer and the first reference plane, the via in electrical communication with the signal layer,
    wherein an inner area of the first reference plane up to the via is eliminated, and wherein a portion of the first reference plane is disposed below the integrated circuit.

2. The PCB as recited in claim 1, further comprising:
    a second reference plane defined adjacent to a second side of the signal layer, the second side of the signal layer being opposite the first side of the signal layer, wherein the via passes through the second reference plane, and further wherein an inner area of the second reference plane up to the via is eliminated.

3. A printed circuit board (PCB) onto which an integrated circuit package containing an integrated circuit is mounted, comprising:
    an upper signal layer;
    a lower signal layer;
    an upper reference plane separating the upper signal layer and the lower signal layer;
    a lower reference plane disposed under the lower signal layer;
    an innermost via configured to accept an electrical signal from an innermost contact terminal to be routed on the upper signal layer; and
    an outermost via configured to accept an electrical signal from an outermost contact terminal to be routed on the lower signal layer,
    wherein at least one of an inner area of the upper reference plane up to the innermost via and an inner area of the lower reference plane up to the outermost via are eliminated, and wherein a portion of the upper reference plane and the lower reference plane are disposed below the integrated circuit.

4. The PCB as recited in claim 3, wherein a surface area of the inner area of the upper reference plane is less than a surface area of the inner area of the lower reference plane.

5. The PCB as recited in claim 3, further comprising:
    a plurality of signal layers defined between the upper signal layer and the lower signal layer;
    a plurality of reference planes defined between the upper reference plane and the lower reference plane, wherein each reference plane of the plurality of reference planes is disposed under a corresponding signal layer of the plurality of signal layers when proceeding from the upper reference plane to the lower signal layer; and
    a plurality of successive vias extending from the innermost via to the outermost via, each via of the plurality of successive vias is in electrical communication with a corresponding contact terminal of a plurality of successive contact terminals when proceeding from the innermost contact terminal to the outermost contact terminal, wherein each via of the plurality of successive vias is in electrical communication with a successively lower signal layer when proceeding from the innermost via to the outermost via, and further wherein an inner area of one or more successively lower reference planes up to a corresponding successive via is eliminated when proceeding from the innermost via to the outermost via.

6. The PCB as recited in claim 5, wherein a surface area of the inner area of each successively lower reference plane is less than a surface area of the inner area of a next successively lower reference plane.

7. The PCB as recited in claim 5, wherein the innermost contact terminal, the successive contact terminals, and the outermost contact terminal are included in an integrated circuit component mounted on the PCB.

8. The PCB as recited in claim 7, wherein the integrated circuit component includes one of a memory chip, a processor chip, an I/O chip, an application specific integrated circuit, a logic chip, and a field programmable gate array.

9. The PCB as recited in claim 6, wherein a surface area of the inner area of the lower reference plane can be substantially equivalent to a surface area of the integrated circuit component.

10. The PCB as recited in claim 5, wherein eliminating at least one inner area of the inner area of the upper reference plane, the inner area of the lower reference plane, and the inner areas of successively lower reference plane substantially reduces transition capacitance in the PCB.

11. The PCB as recited in claim 3, the PCB further comprising:
    a top reference plane disposed above the upper signal layer, wherein an inner area of the top reference plane up to the innermost via is eliminated.

12. An electronic system, the system comprising:
    a printed circuit board (PCB) onto which an integrated circuit package containing an integrated circuit is mounted, the PCB including,
        an upper signal layer;
        a lower signal layer;
        an upper reference plane separating the upper signal layer and the lower signal layer;
        a lower reference plane disposed under the lower signal layer;

an innermost via; and an outermost via; and a chip component mounted on the PCB, the chip component including a plurality of successive contact terminals, the innermost via is in electrical communication with an innermost contact terminal of the plurality of successive contact terminals to be routed on the upper signal layer and the outermost via is in electrical communication with an outermost contact terminal of the plurality of successive contact terminals to be routed on the lower signal layer, wherein at least one of an inner area of the upper reference plane up to the innermost via and an inner area of the lower reference plane up to the outermost via are eliminated, and wherein a portion of the upper reference plane and the lower reference plane are disposed below the integrated circuit.

13. The electronic system as recited in claim 12, wherein a surface area of the inner area of the upper reference plane is less than a surface area of the inner area of the lower reference plane.

14. The electronic system as recited in claim 12, wherein the PCB further includes, a plurality of signal layers defined between the upper signal layer and the lower signal layer;

a plurality of reference planes defined between the upper reference plane and the lower reference plane, wherein each reference plane of the plurality of reference planes is disposed under a corresponding signal layer of the plurality of signal layers when proceeding from the upper reference plane to the lower reference plane; and a plurality of successive vias, each via of the plurality of successive vias is in electrical communication with a corresponding contact terminal of a plurality of successive contact terminals, wherein each via of the plurality of successive vias routes a corresponding electrical signal on a successively lower signal layer when proceeding from the innermost via to the outermost via, wherein at least an inner area of inner areas of the successively lower reference planes up to a corresponding successive via is eliminated when proceeding from the innermost via to the outermost via.

15. The electronic system as recited in claim 14, wherein a surface area of the inner area of each successively lower reference plane is less than a surface area of the inner area of a next successively lower reference plane.

16. The electronic system as recited in claim 12, wherein the chip component includes one of a memory chip, a processor chip, an I/O chip, an application specific integrated circuit, a logic chip, and a field programmable gate array.

* * * * *